US00RE36732E

United States Patent [19]

Miyamoto

[11] E Patent Number: Re. 36,732

[45] Reissued Date of Patent: Jun. 13, 2000

[54] NON-VOLATILE MEMORY DEVICE WITH A SENSE AMPLIFIER CAPABLE OF COPYING BACK

[75] Inventor: Junichi Miyamoto, Yokohama, Japan

[73] Assignee: Kabushiki Kaisha Toshiba, Japan

[21] Appl. No.: 08/965,426

[22] Filed: Nov. 6, 1997

Related U.S. Patent Documents

Reissue of:

[64] Patent No.: 5,465,235
Issued: Nov. 7, 1995
Appl. No.: 08/297,753
Filed: Aug. 30, 1994

[30] Foreign Application Priority Data

Sep. 2, 1993 [JP] Japan ..... 5-218499
Jul. 29, 1994 [JP] Japan ..... 6-178194

[51] Int. Cl.[7] ..... G11C 13/00

[52] U.S. Cl. ..... 365/203; 365/185.24

[58] Field of Search ..... 365/189.01, 185.24, 365/203

[56] References Cited

U.S. PATENT DOCUMENTS 5,383,158 1/1995 Ikegami ..... 365/203

*Primary Examiner*—Terrell W. Fears
*Attorney, Agent, or Firm*—Banner & Witcoff, Ltd.

[57] ABSTRACT

Disclosed is a non-volatile semiconductor memory device for transferring data which is inverted data of held data onto bit lines, without reading out read data to an external unit, when data is copied back. This device comprises NAND memory cells connected to bit lines, a flip-flop circuit for temporarily holding write data, a P channel transistor for precharging the bit lines to a predetermined potential, an N channel transistor for connecting the bit lines to the flip-flop circuit, and an N channel transistor having both ends connected between a node of the flip-flop circuit on the opposite side to the bit lines and one end of the transistor on the bit line side. The transistor is provided to hold read data and then output a potential according to its inverted data onto the bit lines. The individual terminals of the flip-flop circuit are connected via a column gate to an I/O line and a BI/O line (inverted-signal line of I/O).

26 Claims, 7 Drawing Sheets

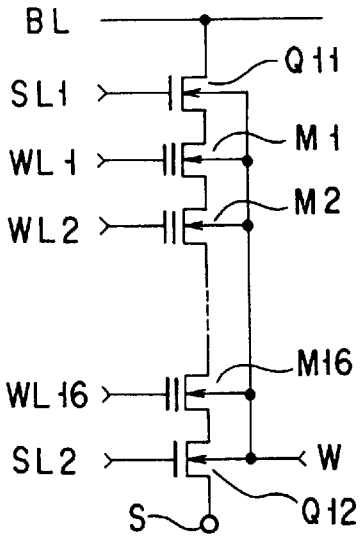
FIG. 1
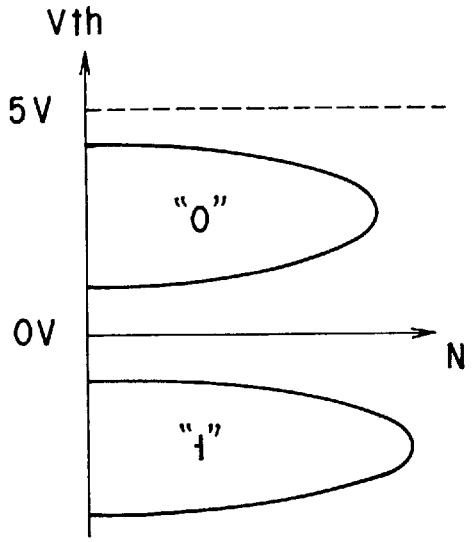
FIG. 2
| | READ | ERASE | WRITE |
|---|---|---|---|
| BL | 5V PRECHARGE | OPEN | WRITE "0" 0V<br>WRITE "1" 9V |
| SL1 | 5 V | 0 V | 11 V |
| WL | SELECTED 0V<br>UNSELECTED 5V | 0V | SELECTED 18V<br>UNSELECTED 9V |
| SL2 | 5 V | 0 V | 0 V |
| W | 0 V | 18 V | 0 V |
| S | 0 V | 18 V | 0 V |
FIG. 3

NON-VOLATILE MEMORY DEVICE WITH A SENSE AMPLIFIER CAPABLE OF COPYING BACK

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a non-volatile semiconductor device, and, more particularly, to a sense amplifier used in a writing operation and a reading operation.

2. Description of the Related Art

Because non-volatile semiconductor memory devices have advantages such as data remaining intact even powered off, their demand is considerably increasing recently. A flash memory which is an electrically erasable non-volatile semiconductor memory device, unlike a bitransistor byte type non-volatile semiconductor memory device, has memory cells each of which can be constituted of a single transistor. This design can reduce the size of the memory cells, so that the flash memory is expected to replace a large capacity magnetic disk or the like. Those non-volatile semiconductor memory devices are designed in such a manner that a memory cell array has memory cells arranged in a matrix form, each cell constituted of an MOS transistor with a floating gate, and stores information in the form of the threshold value of the MOS transistor, which can be changed by accumulating charges in this floating gate. Since information writing and erasure are executed by supplying a current to the insulating film of the MOS transistor, the writing time considerably changes depending on variations in the fabrication process, use conditions and so forth. This is a significant difference between the flash memory and a DRAM or SRAM. Apparently, fast writing cells and slow writing cells coexist in the same chip.

To explain those shortcomings in detail, a NAND type flash memory as one example of such conventional non-volatile semiconductor memory devices will be discussed below.

FIG. 1 is a circuit diagram showing the cell structure of a NAND type flash memory. Non-volatile memory cells M1 to M16 each constituted of an MOS transistor having a floating gate are connected in series, with one end of the series circuit being connected via a select transistor Q11 to a bit line BL while the other end is connected via a select transistor Q12 to a common source line s. The individual transistors are formed on the same well substrate (well region) W. The control electrodes of the memory cells M1–M16 are respectively connected to word lines WL1 to WL16, the control electrode of the select transistor Q11 is connected to a select line SL1 and the control electrode of the select transistor Q12 is connected to a select line SL2.

The memory cells M1–M16 have threshold values corresponding to data they hold themselves; the threshold value is set greater than 0 V and smaller than 5 V when data "0" is held and the threshold value is set smaller than 0 V when data "1" is held. To be more specific, the threshold value is set smaller within a predetermined range to provide a certain margin.

FIG. 2 is a threshold value distribution diagram showing the distribution of the threshold values of the memory cells. In the case of the NAND type flash memory, the state of holding data "1" is called "erased state" while the state of holding data "0" is called "written state." Shifting the threshold value (Vth) of a memory cell holding data "1" in the positive direction so that data "0" is held is called "writing operation" and shifting the threshold value (Vth) of a memory cell holding data "0" in the negative direction so that data "1" is held is called "erasing operation." Those definitions may differ in the case of a NOR type memory cell.

FIG. 3 presents a table which shows voltages applied to memory cells having the structure shown in FIG. 1 at the time of executing the erasing and writing operations. In read mode, the bit line BL is precharged to 5 V to be in a floating state, followed by application of 5 V to the select line SL1, 0 V to the word line WL for the selected memory cell, 5 V to the word line WL for the unselected memory cells, 5 V to the select line SL2, 0 V to the well region and 0 V to the common source line S. Then, all the transistors except for the selected memory cell (including the unselected memory cells) are turned on. With data "0" held in the selected memory cell, this memory cell becomes nonconductive and the potential of the bit line is left unchanged to 5 V. When data "1" is held in the selected memory cell, on the other hand, this memory cell conducts so that the bit line is discharged and the potential drops. Sensing data is conducted by detecting the potential of the bit line at the time of data reading.

FIG. 4 is a threshold value distribution diagram at the time erasure of the memory cell in FIG. 1 is performed, FIGS. 5A and 5B are threshold value distribution diagrams at the time data is written in the memory cell. In erasing mode, the bit line BL is set free, 0 V is applied to the select line SL1, 0 V is applied to the word line WL of the memory cell, 0 V is applied to the select line SL2, 18 V is applied to the well region W and 18 V is applied to the common source line S. As a result, a tunnel current flows between the floating gate and the well region via the gate insulating film, and the threshold value becomes smaller than 0 V. FIG. 4 shows the shifting of the distribution of the threshold values.

In write mode, different voltages are applied depending on the data to be written. 0 V is applied to the bit line BL to write "0" (to shift the threshold value), while 9 V is applied to the bit line BL to write "1" (not to shift the threshold value). 11 V is applied to the select line SL1, 18 V is applied to the word line WL of the selected memory cell, 9 V is applied to the word line WL of the unselected memory cells, 0 V is applied to the select line SL2, 0 V is applied to the well region W and 0 V is applied to the common source line S. As a result, all the transistors from the selected transistor Q11 to that of the memory cell M16 conduct to have the same potential as that of the bit line (no consideration is given to a drop in threshold value of transistors).

Therefore, a high voltage of 18 V is applied between the channel and control electrode of the memory cell whose bit line BL is applied with 0 V, so that a tunnel current flows and the threshold value is shifted in the positive direction. Only 9 V is applied between the channel and control electrode of the memory cell whose bit line BL is applied with 9 V, thus suppressing the shifting of the threshold value in the positive direction. This 9 V is called "write disable voltage." FIGS. 5A and 5B show the shifting of those threshold value distribution.

As described earlier, non-volatile semiconductor memory devices perform data writing using the physical means called "tunnel current," so that the writing speed varies depending on the individual memory cells.

For slow writing memory cells, "0" is written at a certain time at which the threshold values of fast writing memory cells may exceed 5 V that is the upper limit for the "0" cells. In this case, data of the whole NAND cells cannot be read and the NAND cells become defective. That is, the control of the threshold values of the cells is the operational key point.

FIG. 6 is a circuit diagram of a conventional circuit for explaining the reading and writing operations on the memory cell in FIG. 1. FIG. 6 shows one bit line and each unit consisting of a plurality of NAND memory cells for diagrammatic simplification. Actually, several thousands bit lines are laid and NAND cells are laid in an array.

A flip-flop circuit (FF) comprises clocked CMOS inverters 1 and 2 whose active control is carried out by clock signals CK and BCK (inversion of CK), and temporarily holds written data. Connected to each bit line BL are NAND memory cells (MC) similar to those which have already been explained with reference to FIG. 1. Further connected to this bit line BL are a P channel transistor Q21 for charging the bit line BL and a transistor Q22 which connects the bit line BL to the FF circuit. Both ends of the FF circuit are connected to I/O lines 13 and 14 via a transfer gate.

Writing is executed in the following manner. The FF circuit is set active (CK is set to an "H" level) and data is written from the I/O lines 13 and 14. The FF circuit connected to the bit line BL corresponding to a cell to which "0" is to be written is set in such a manner that a terminal 15 connected to the bit line BL becomes "L" to turn on the transistor Q22. 0 V is applied to the bit line BL to write "0" in the selected cell. For the bit line BL corresponding to a cell which should be left holding "1," the terminal 15 is set to "H." At this point of time, the voltage of the source 16 of the PMOS transistor is set to 9 V to turn on the transistor Q22. 9 V is applied to the bit line BL, providing the same writing bias condition as shown in FIG. 3.

Reading is performed as follows. Referring to the waveform chart in FIG. 7, first, the FF circuit is disabled (CK is set to an "L" level) and the bit line BL is precharged to 5 V. Then, the transistor Q22 is turned on to set the control gate of the selected cell to 0 V and the control gates of the unselected cells to 5 V. Accordingly, the potential of the bit line to which the cells whose threshold values have exceeded 0 V are connected does not change, while the potential of the bit line to which the cells whose threshold values are equal to or smaller than 0 V are connected decreases with time in accordance with the cell current as indicated by a curve 18. By rendering the FF circuit active after a proper interval, e.g., at time t1, the potential of the bit line BL is latched in the FF circuit. More specifically, the voltage at the terminal 15 is latched to become "H" for data "0" and "L" for data "1."

FIG. 8 is a plan view showing the layout of the above-described memory cell array and a sensing circuit. A plurality of sense amplifiers 31, e.g., 4 K sense amplifiers, each comprising the aforementioned FF circuit are laid along one side of a memory cell array 32. Data of the cells in a row 33 are simultaneously input to the sense amplifiers 31. Data can be externally written in the FF circuits constituting the sense amplifiers to simultaneously write data in the cells of the row 33.

In some application, however, all the data of the cells of the row 33 should simultaneously be copied to cells of another row 34. This is called "copy back." Let us consider the case where this function is accomplished by using the sense amplifiers 31 of the conventional circuit. First, data of the row 33 are input to the sense amplifiers 31. At this time, the bit line terminal 15 for reading the memory cells holding "0" is detected to have an "H" level and the bit line terminal 15 for reading the memory cells holding "1" is detected to have an "L" level. When data is written in the cells of the row 34 under this condition, the bit line with the terminal 15 set to "H" has an intermediate potential so that nothing is written in the cells connected to this bit line, while "0" is written in the cells connected to the bit line with the terminal 15 set to "L." Consequently, even if the cells of the row 34 are in an erased state, inverted data is written in the cells of the row 34. That is, to precisely accomplish the copy back in the conventional circuit, it is necessary to simultaneously input data of the cells to the sense amplifiers 31 first, then read the data out to an external unit, invert the data and write the inverted data again in the sense amplifiers 31, and then simultaneously write the data into the cells. This system requires a data control unit outside and involves a considerable time loss of reading data from the memory cells and writing the data again into the cells.

SUMMARY OF THE INVENTION

It is therefore an object of the present invention to provide a non-volatile semiconductor memory device which executes a copy back or the like of simultaneously copying memory data of one row to another row without using external CPU power, thus significantly reducing the time loss in the copy back operation.

This object is achieved by the following structure.

A non-volatile semiconductor memory device comprising:

memory cells each constituted of a transistor having a charge accumulating layer, each for, in write mode, storing data corresponding to a threshold value which changes greatly as an absolute value of a difference between potentials applied to a drain and a gate becomes larger;

bit lines to each of which drains of a plurality of memory cells are commonly connected;

precharge means for precharging the bit lines to a predetermined potential in read mode;

data holding means for temporarily holding data read from the memory cells; and inverted-data outputting means for outputting a potential corresponding to inversion of the data held in the data holding means, to the bit lines.

With the structure of this invention, in copying data of a cell to another cell in a NAND memory cell structure, the data held in the data holding means is transferred to the bit lines by the inverted-data outputting means without sending the read data to an external unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing the cell structure of a NAND type flash memory;

FIG. 2 is a threshold value distribution diagram showing the distribution of the threshold values of the memory cell in FIG. 1;

FIG. 3 is a diagram exemplifying voltages to be applied to individual portions at the time of reading, erasing and writing data from and in the memory cell in FIG. 1;

DETAILED DESCRIPTION OF THE PREFERRED EMBODIMENTS

Figure 9:
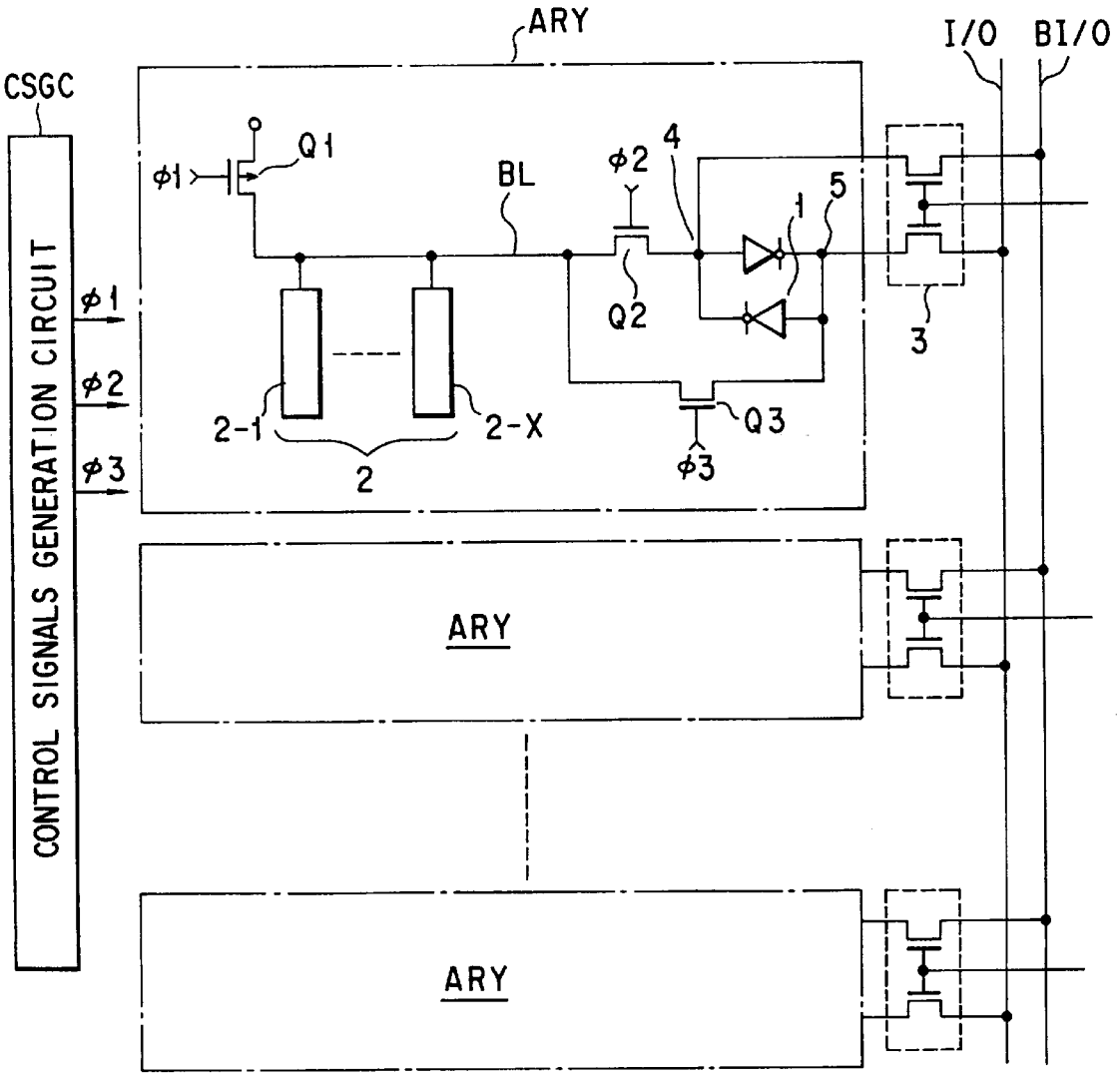
FIG. 9 is a circuit diagram showing the structure of the essential portion of a non-volatile semiconductor memory device according to a first embodiment of the present invention.

FIG. 9 is a circuit diagram showing the structure of the essential portion of a non-volatile semiconductor memory device according to a first embodiment of the present invention, namely, a sensing circuit that is concerned with data writing and reading. For the sake of diagrammatic simplification, FIG. 9 shows each unit consisting of a plurality of NAND memory cells whose drains are commonly connected to a bit line. Actually, circuits ARY encircled by an alternate short and long dash line are connected in parallel, several thousands bit lines are laid, and NAND cells are laid in an array.

More specifically, each unit comprises a flip-flop (FF) circuit 1 for temporarily holding written data, a bit line BL, NAND memory cells 2 of the type explained earlier with reference to FIG. 1 and connected to the bit line BL, a P channel transistor Q1 for precharging the bit line BL to a predetermined potential, an N channel transistor Q2 for connecting the bit line BL to the FF circuit 1, and an N channel transistor Q3 having both ends connected between a node of the FF circuit 1 on the opposite side to the bit line BL and a bit-line side end of the transistor Q2. This transistor Q3 is provided to hold read data and then output a potential corresponding to inverted data of the read data to the bit line BL. The individual terminals of the FF circuit 1 are connected to an I/O line and a BI/O line (inverted signal line of I/O) via a column gate 3. The control signal generation circuit CSGC generates $\phi 1$, $\phi 2$ and $\phi 3$ driving operation modes. The CSGC is sequentially control circuit (not shown).

Figure 10:
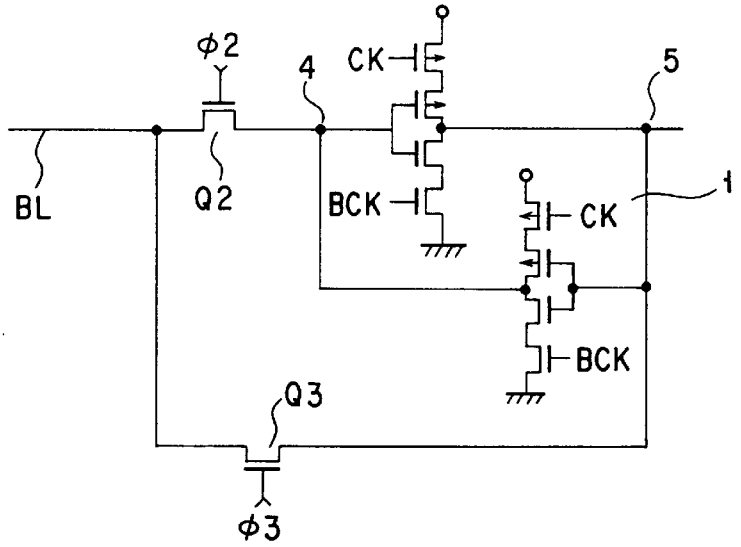
FIG. 10 is a circuit diagram showing a more specific structure of a part of the device shown in FIG. 9.

A $\phi 1$ signal line is connected to the gate of the transistor Q1 to control the precharging. A $\phi 2$ signal line and a $\phi 3$ signal line are respectively connected to the gate of the transistor Q2 and the gate of the transistor Q3, and are controlled at predetermined timings. The source of the transistor Q1 is connected to a power supply which provides a supply voltage of 9 V in write mode and a supply voltage of 5 V otherwise. The power supply for the FF circuit 1 is likewise designed so as to provide a supply voltage of 9 V in write mode and a supply voltage of 5 V otherwise. The FF circuit 1 is constituted of a clocked inverter as shown in FIG. 10, for example.

A description will now be given of the operation of copying data of a memory cell 2-X to a memory cell 2-1 in the structure shown in FIG. 9. It is assumed that the copying destination cell 2-1 has been erased previously, i.e., it has been set ON previously. First, data of the cell 2-X is read out. At this time, the individual transistors of the FF circuit 1 which receive clocks CK and BCK (inversion of CK) shown in FIG. 10 are cut off and are disabled. The transistor Q2 connected to the bit line BL is set off and the transistor Q3 is also set off. Suppose that the bit line BL is precharged to an "H" level and the transistor Q2 is turned on to set the bit line BL in a free running state.

After a proper time elapses, the FF circuit 1 is enabled. When the potential of the bit line BL then is higher than the threshold value voltage of the FF circuit 1, i.e., when data is written in the cell 2-X and the threshold value is high, a node 4 between the bit line BL and the FF circuit 1 is set to an "H" level. If the cell 2-X is left erased or off, the bit line BL is discharged so that the node 4 is set to an "L" level. This completes the reading operation. That is, the read data in the cell 2-X is latched in the FF circuit 1.

In copying data of the FF circuit 1 to the cell 2-1, the power supply potential of the FF circuit 1 is increased (9 V) and the transistor Q2 is turned off while the transistor Q3 is turned on. Consequently, a signal complimentary to the signal at the node 4 or a signal at a node 5 appears on the bit line BL. In other words, if the read cell 2-X is in an ON state (holding data "1") and the node 4 is thus set to "L," the node 5 on the opposite side is at an "H" level. As a result, the bit line BL is precharged to an intermediate potential, so that even if the select gate of the cell 2-1 (the select transistor Q11 in FIG. 1) is set on to enter the writing operation, a sufficient potential difference is not given to the cell 2-1. Therefore, no data is written in the cell 2-1 and this cell 2-1 is left on (holding data "1"). If the cell 2-X is in an OFF state (holding data "0") and the node 4 is thus set to "H," on the other hand, the node 5 on the opposite side is at an "L" level. When the writing operation is initiated, therefore, the bit line BL is precharged to "L," giving a a sufficient potential difference to the cell 2-1, so that data "0" is written in the cell 2-1.

According to this embodiment, the content of the memory cell 2-X, latched in the FF circuit 1, is copied to another memory cell 2-1 without being read out to an external unit. As this copy back is simultaneously performed in the sensing circuit of this invention including the parallel-connected FF circuits 1, quick page copying is possible.

Figure 11:
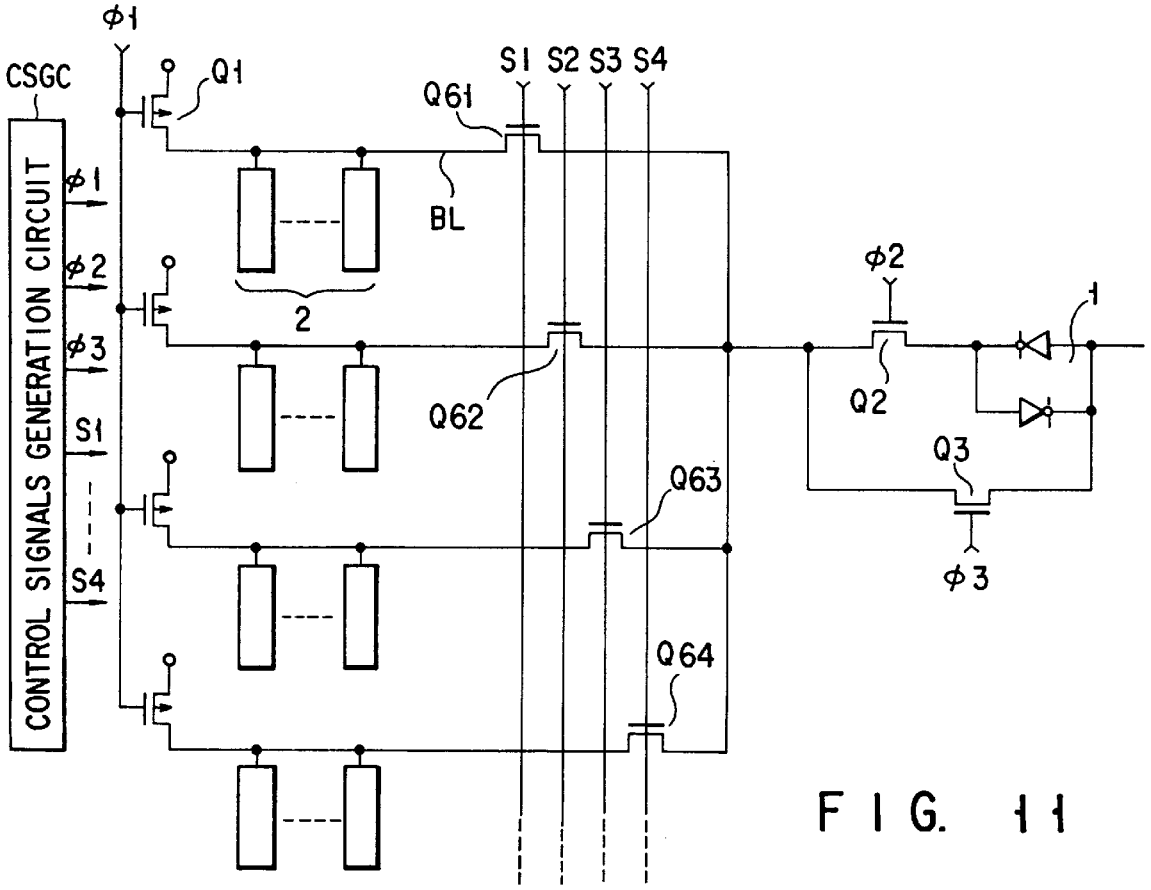
FIG. 11 is a circuit diagram showing the structure of a second embodiment to which the memory cell in FIG. 1 is applied.

FIG. 11 is a circuit diagram of a second embodiment, in which the FF circuit 1 in FIG. 10 is shared by a plurality of bit lines. The switching of the bit lines is performed by transistors Q71 to Q74 which are controlled by signals S1 to S4. This example reduces the pattern area and is effective when data is shifted in the column direction or data is simultaneously output on the shared bit lines.

Figure 12:
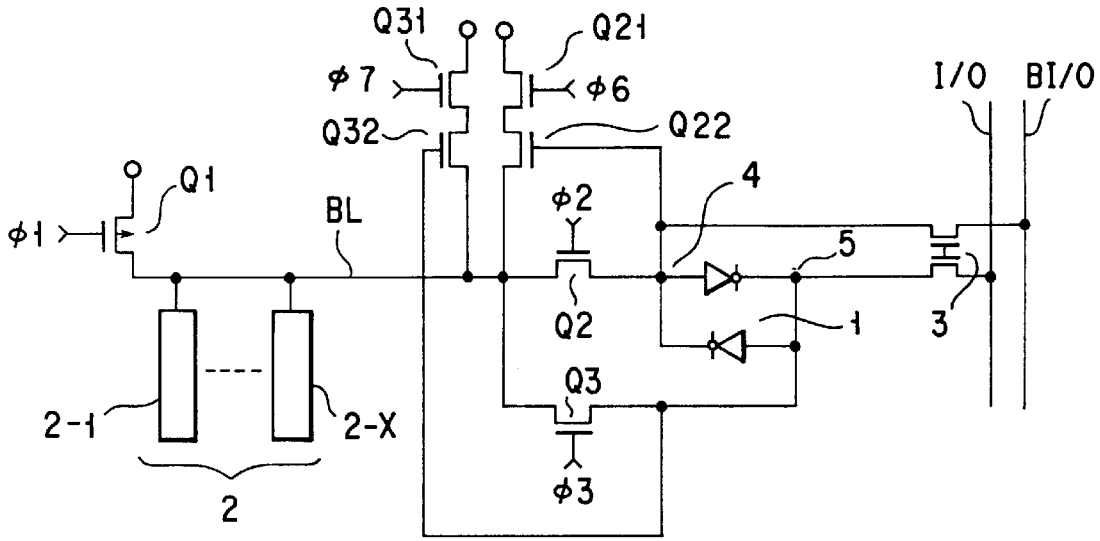
FIG. 12 is a circuit diagram showing the structure of the essential portion of a third embodiment of this invention.

FIG. 12 is a circuit diagram of a third embodiment to which a verifying function is added. This circuit has a verifying function effective for both the ordinary writing operation and the copy-back writing operation which is concerned in this invention. Transistors Q21 and Q22 are connected in series and transistors Q31 and Q32 are also connected in series between the power supply and the bit line BL. The gates of the transistors Q21 and Q31 are respectively controlled by control signals $\phi 6$ and $\phi 7$ for verification. The gates of the transistors Q22 and Q32 are respectively controlled by signals at the nodes 4 and 5 of the FF circuit 1.

The verification for the ordinary writing is performed using the illustrated N channel transistors Q21 and Q22. This verification will be described briefly for two cases (i) and (ii).

(i) In the case where the node 4 is set to "L" and an operation of writing data "0" in the selected cell is performed, when a given time (free running period) elapses after the precharging of the bit line BL caused by turning the transistor Q2 off and the transistor Q1 on in the reading operation at the next verification, the following cell states are possible.

(1) The cell which has surely obtained a threshold value as data "0" holds the precharged potential of the bit line.

(2) The cell whose threshold value has not yet been set sufficiently or the cell in which the necessary amount of electrons has not been injected is close to the ON state and discharges the precharged potential of the bit line.

After the free running period, the transistor Q21 is turned on by the signal $\phi 6$. As the node 4 is at an "L" level, the transistor Q22 is set off, so that the bit line on which data "0" is to be written is not affected at all. When the transistor Q21 is turned off and the transistor Q22 is turned on to connect the bit line BL to the FF circuit 1, the node 4 of the FF circuit 1 changes to "H" from "L" in the cell state (1). The latched data in the FF circuit 1 is therefore inverted and the selected cell connected to this bit line BL is eliminated from the next rewriting operation. In the cell state (2), the node 4 of the FF circuit 1 is left at "L" and the next rewriting operation is performed. More specifically, the transistor Q2 is turned off by the signal $\phi 2$ to electrically disconnect the bit line BL from the FF circuit 1, and the transistor Q1 is turned on by the signal $\phi 1$ to precharge the bit line BL. Next, the transistor Q2 is turned on by the signal $\phi 2$ to set the "L" level of the node 4 to the FF circuit 1 to the bit line potential to execute the writing operation again. This rewriting is repeated until the state (1) is obtained at the time of verification.

(ii) In the case where the node 4 is set to "H" and an operation of writing data "1" in the selected cell is performed or an operation of keeping the memory cell erased is performed, when a free running period elapses after the precharging of the bit line BL caused by turning the transistor Q2 off and the transistor Q1 on in the reading operation at the next verification, the precharged potential of the bit line is inevitably discharged. After the free running period, the transistor Q21 is turned on by the signal $\phi 6$. As the node 4 is at an "H" level, the transistor Q22 is set on, so that the "H" level of the node 4 is transferred to this bit line. When the transistor 921 is turned off and the transistor Q22 is turned on to connect the bit line BL to the FF circuit 1, the latched data of the FF circuit 1 does not change because the bit line BL has the same potential as the "H" level of the node 4. The "H" level of the node 4 of the FF circuit 1 is boosted as the write disable voltage when the writing period comes, keeping the potential of the bit line at the write disable voltage. That is, no data is written in the bit line which is connected to the H-level node 4 of the FF circuit 1.

As described above, the N channel transistor which is controlled by the signal $\phi 7$ and the N channel transistor Q32 which is controlled by the signal at the node 5 in the diagram perform the copy-back write verify in the same manner as the ordinary write verify. As described with reference to FIG. 9, data is copied back. Thereafter, the transistors Q31 and Q32 are used instead of the transistors Q21 and Q22 to verify that the copied-back data is correctly written in the same sequence as the ordinary write verify, and to execute rewriting as needed. When the copy-back verifying operation is completed, the node 5 is set to "H."

Figure 4:
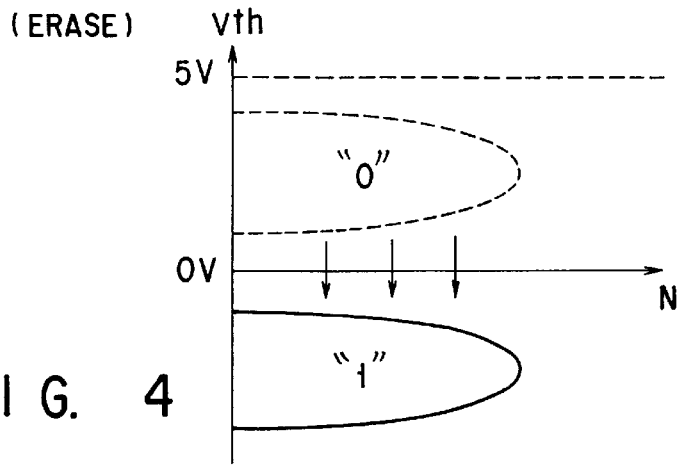
FIG. 4 is a threshold value distribution diagram at the time erasure of the memory cell in FIG. 1 is performed.
Figure 5A:
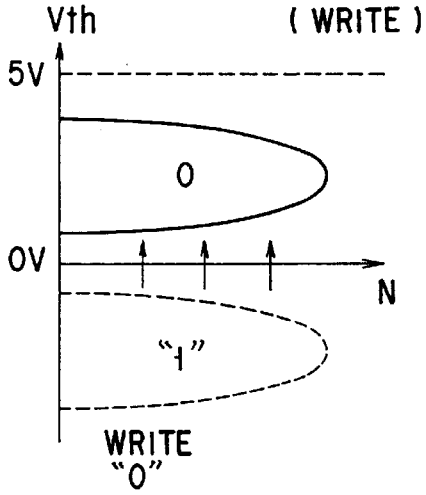
FIGS. 5A and 5B are threshold value distribution diagrams at the time data is written in the memory cell in FIG. 1.
Figure 5B:
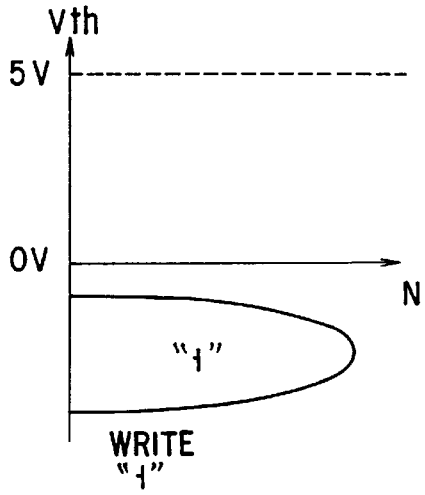
Figure 6:
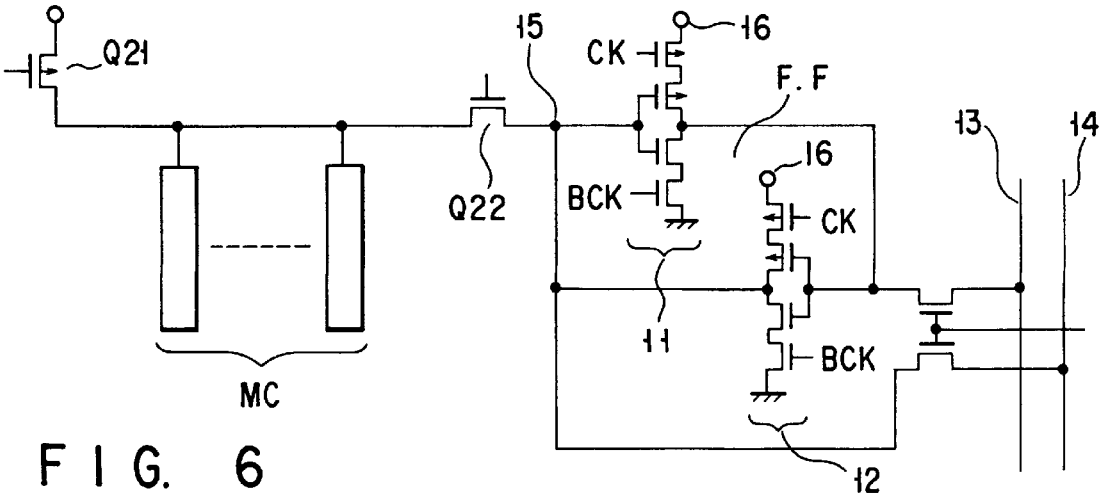
FIG. 6 is a diagram of a conventional circuit for explaining data reading and writing from and in the memory cell in FIG.
Figure 7:
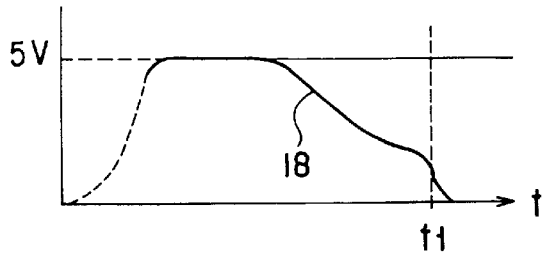
FIG. 7 is a waveform diagram showing a change in potential of a bit line in read mode.
Figure 8:
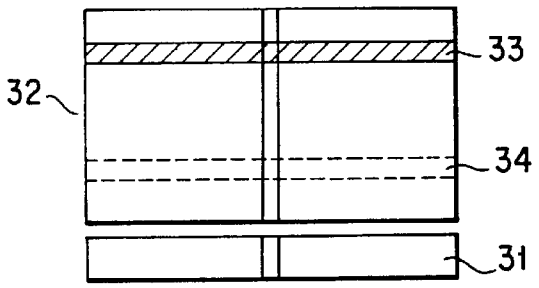
FIG. 8 is a plan view showing the layout of a memory cell array and a sensing circuit.
Figure 13:
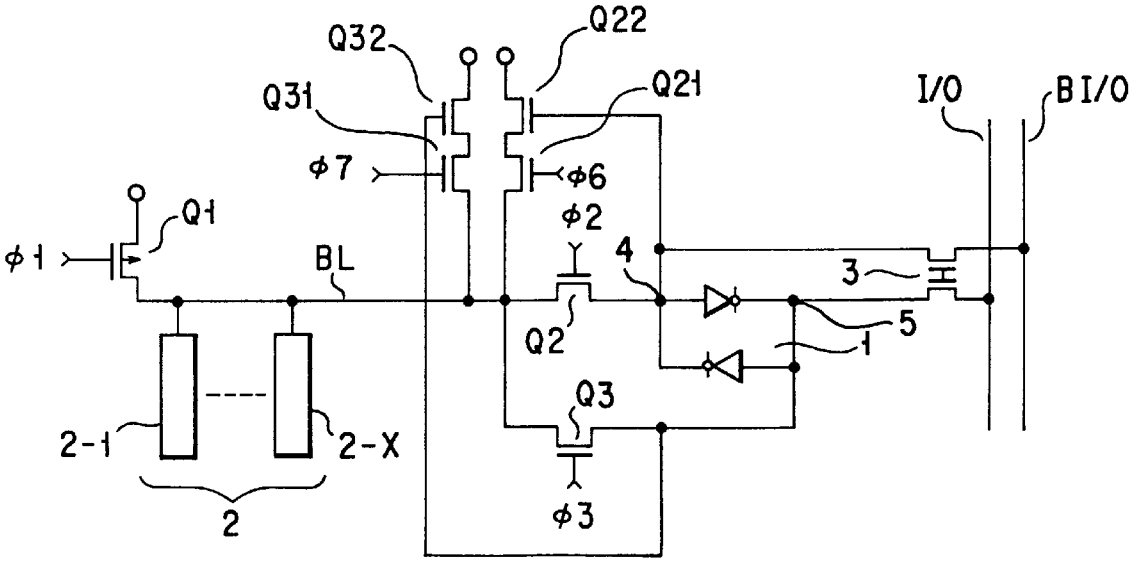
FIG. 13 is a circuit diagram showing the structure of the essential portion of a fourth embodiment of this invention.

FIG. 13 is a circuit diagram of a fourth embodiment in which the series connection of the transistors Q21 and Q22 and the series connection of the transistors Q31 and Q32 are reversed to those shown in FIG. 4. The operation of this embodiment is the same as that of the circuit shown in FIG. 4.

Figure 14:
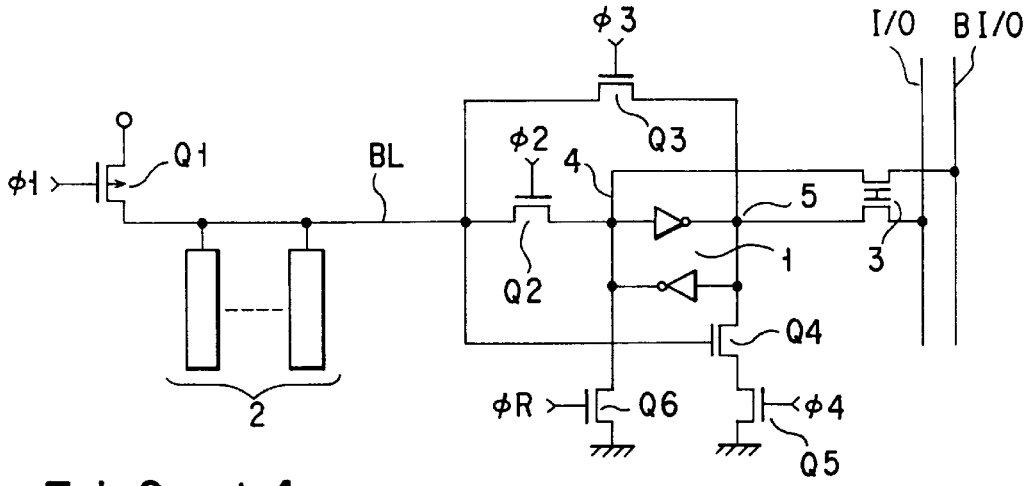
FIG. 14 is a circuit diagram showing the structure of the essential portion of a fifth embodiment of this invention.

FIG. 14 is a circuit diagram of a fifth embodiment according to which the inverted-data outputting means in FIG. 9 embodying this invention is applied to a sensing circuit having a verifying circuit called "forced inversion type." The FF circuit 1 here does not use a clocked inverter. When the transistor whose gate receives the bit line potential is turned on, the data node of the FF circuit 1 is forcibly set to the ground potential to invert the data in the FF circuit 1. The FF circuit 1 is need not therefore be constituted of a clocked inverter. This embodiment is effective in reducing the number of elements in the FF circuit 1 and the occupying area.

The circuit structure in FIG. 14 is the structure of FIG. 9 to which transistors Q4 and Q5, connected in series between the node 5 of the FF circuit 1 and the ground potential of 0 V, and a transistor Q6, connected between the node 4 and the ground potential, are added. The gate of the transistor Q4 is connected to the bit line BL, and the gate of the transistor Q5 is controlled by the signal $\phi 4$. Those transistors Q4 and Q5 constitute the means for forcibly inverting the latched data. A signal line $\phi R$ is connected to the gate of the transistor Q6, which constitutes the reset means.

For the operation of the sensing circuit with the structure shown in FIG. 14, before the bit line potential is read, the transistor Q6 is turned on by the signal $\phi R$ to initialize the FF circuit 1. Thereafter, to read cell data, the bit line BL is precharged to turn on the transistor Q2, setting the bit line in a free running state. After a given time, the transistor Q5 is turned on. If the bit line potential is an "L" level, the state of the FF circuit 1 is the same as the initial state. If the bit line potential is an "H" level, the state of the FF circuit 1 is inverted, resetting the node to "L" from "H." That is, when the conditions (i) and (ii) are given to the circuit with the structure shown in FIG. 13, the verifying operation is conducted as follows. First, in the write condition of (i), there are also two possible states (1) and (2). Then, the transistor Q5 is turned on. If the cell state is the state (1), the latched data of the FF circuit 1 is inverted and the selected cell connected to this bit line is eliminated from the next rewriting. This is because the node 4 in the next rewriting is at the level "H" and the write disable voltage is applied to the bit line. In the state (2), the transistor Q4 is not turned on and the node 4 remains at the "L" level, so that the next rewriting is performed. This rewriting operation is repeated until the state (1) is obtained at the time of verification. Under the writing condition (ii), the bit line inevitably becomes a discharged state, so that the transistor Q4 is not turned on and the node 4 remains at the "H" level. In the next rewriting operation, therefore, the write disable voltage is applied to the bit line in the next rewriting mode as done first time. That is, no data is written in the bit line connected to the node 4 of the FF circuit 1 which has the level "H."

In executing copy back in the circuit with the structure shown in FIG. 14, the transistor Q2 should be turned off and the transistor Q3 should be turned on to output the potential of the node 5 of the FF circuit 1 to the bit line as done in the circuit of FIG. 9.

Figure 15:
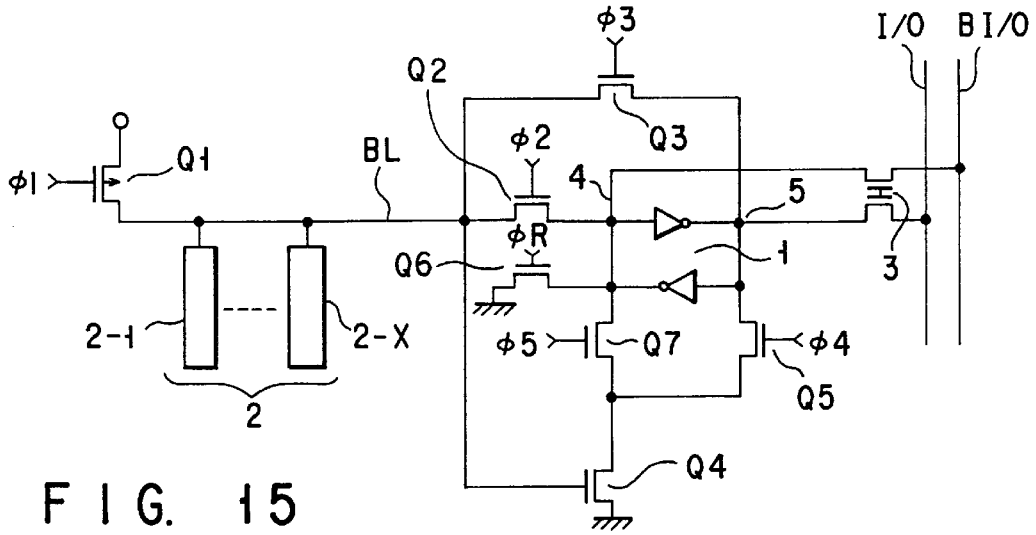
FIG. 15 is a circuit diagram showing the structure of the essential portion of a sixth embodiment of this invention.

FIG. 15 is a circuit diagram of a sixth embodiment that has the structure in FIG. 14 to which a verifying function for the copy-back writing concerning this invention is further added. The nodes 5 and 4 of the FF circuit 1 are connected via the current paths of the transistors Q5 and Q7 to one end of the current path of the transistor Q4 whose gate is controlled by the bit line potential. The other end of the current path of the transistor Q4 is connected to the ground potential. The reset transistor Q6 is provided between the node 4 and the ground potential as in the circuit of FIG. 14.

The transistor Q7 functions, instead of the transistor Q5, to output the potential of the node 5 of the FF circuit 1 and verify the data written at the time of the copy-back writing. The operational sequence is the same as that of FIG. 14. When verification that the copied-back data has been accurately written is completed, the node 4 is set to "L."

The reset transistor Q6 in the above structure is not necessary if a reset path is formed. For example, as separate from the verifying operation for the copied-back data, if all the select gates (select transistor Q11 in FIG. 1) are closed and the transistor Q7 is turned on after the transistor Q1 is precharged, the reset operation is enabled.

Figure 16:
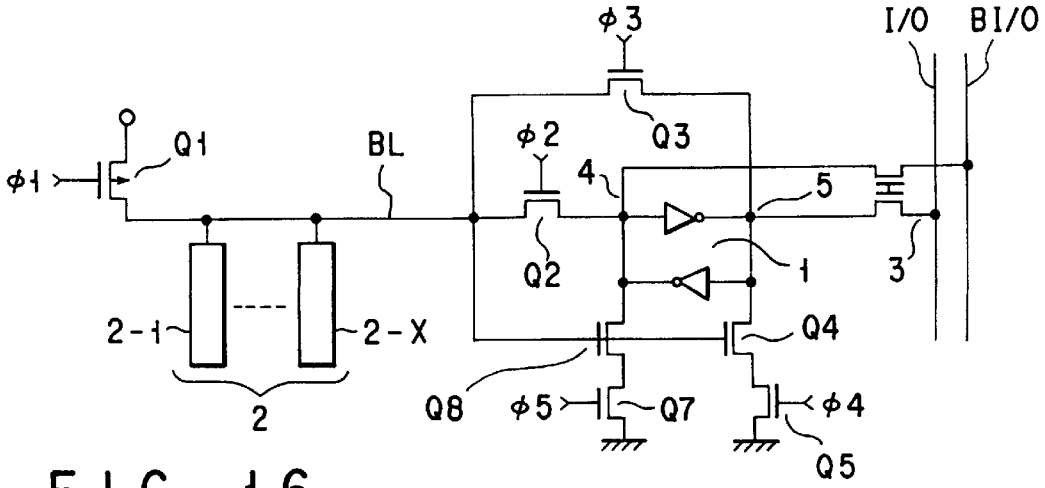
FIG. 16 is a circuit diagram showing the structure of the essential portion of a seventh embodiment of this invention.
Figure 17:
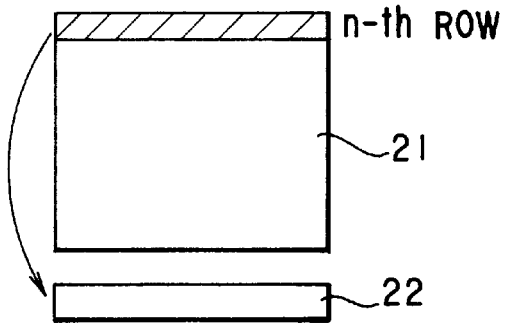
FIGS. 17 through 20 are pattern plan views showing a memory cell array for explaining a memory refresh operation using this invention.

FIG. 16 is a circuit diagram of a seventh embodiment which is designed in such a way that the transistors Q5 and Q7 whose gates are controlled by the verify control signals $\phi 4$ and $\phi 5$ in the structure of FIG. 15 are connected to the ground line. Accordingly, the transistor Q4 whose gate is controlled by the bit line potential and which is shared by the transistors Q7 and Q5 in FIG. 15 becomes necessary for each of the transistors Q7 and Q8, and transistors Q41 and Q42 are thus provided. In this example, the reset transistor Q6 is eliminated. The reset operation is performed at the time the bit line BL is precharged. That is, when the transistor Q1 conducts due to the L-level signal $\phi 1$, the bit line BL is precharged to vcc, rendering the transistors Q41 and Q42 conductive. Under this situation, if the transistor Q7 is rendered conductive by the H-level signal $\phi 5$, the node 4 of the FF circuit 1 is grounded to Vss. The reset operation is completed in this manner. The pattern for the structure of FIG. 16 may be easy depending on the design rules.

Figure 18:
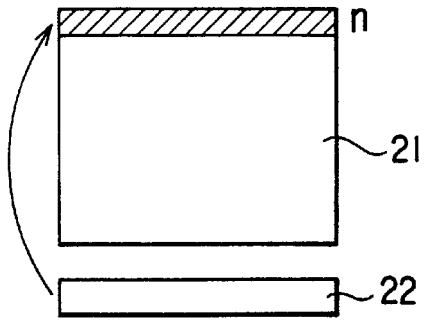
Figure 19:
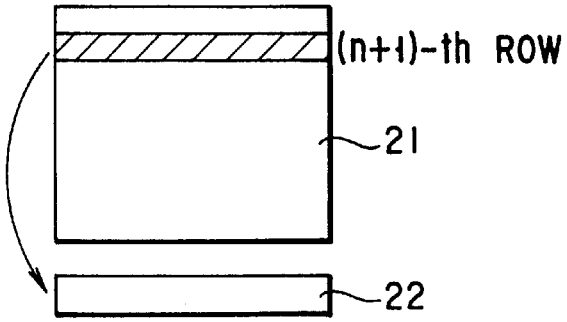
Figure 20:
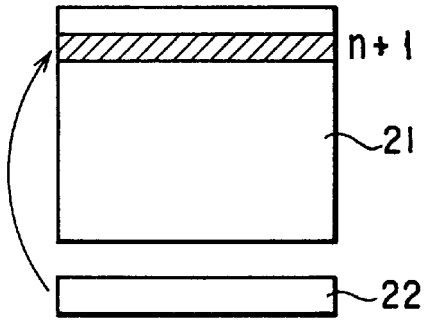

Application examples of this invention will now be discussed below. The charges accumulated in the floating gate may leak due to the deterioration of the oxide film or a defect, causing a reliability problem. The effective method to this problem is the refresh operation. In this respect, the above-described copy back function may be used in the refresh operation. The refresh operation can be performed easily without particularly requiring an external memory as shown in FIGS. 17 to 20. First, the n-th row of data of the memory cell array 21 are read into the sensing circuit 22 as shown in FIG. 9 via the transistor Q2 shown in FIG. 9, for example. Next, the transistor Q3 is turned on to write the same data in the n-th row (copy back) using the data of the sensing circuit as shown in FIG. 18. Likewise, the (n+1)-th row of data are read as shown in FIG. 19 and copy back is performed on the (n+1)-th row as shown in FIG. 20. By sequentially repeating this operation, the same data can be rewritten in all the memory cells which are holding a predetermined charge (refresh operation is performed). If the verifying operation is performed using the structure shown in FIG. 15 or 16 to set the threshold values of the memory cells more accurately, the reliability is further improved.

As described above, according to this invention, the use of the inverted-data outputting means allows the data in the data holding means to be transferred onto the bit line without reading the data to an external unit. It is therefore possible to provide a nonvolatile semiconductor memory device which can easily perform copy back to simultaneously copy a row of memory cell data to another row or a memory refresh operation in a short period of time, thus significantly reducing the time loss in the copy back operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A non-volatile semiconductor memory device comprising:

memory cells each constituted of a transistor having a charge accumulating layer, each of said memory cells storing in write mode data corresponding to a threshold value which changes greatly as an absolute value of a difference between potentials applied to a drain and a gate becomes larger;

bit lines to each of which drains of a plurality of memory cells are commonly connected;

precharge means for precharging said bit lines to a predetermined potential in read mode;

data holding means for temporarily holding data read from said memory cells; and inverted-data outputting means for outputting a potential corresponding to inversion of said data held in said data holding means, to said bit lines.

2. The non-volatile semiconductor memory device according to claim 1, further comprising verifying means for verifying a writing operation on memory cells done by said inverted-data outputting means, said verifying means including transfer control means for controlling connection between said bit lines to said data holding means, and there is a period for electrically disconnecting said bit lines from said data holding means at a time of a verifying operation.

3. The non-volatile semiconductor memory device according to claim 2, wherein said verifying means includes a first verifying transistor which conducts at a time of said verifying operation and a second verifying transistor whose gate is controlled in accordance with a signal at a predetermined node of said data holding means, whereby said first and second verifying transistors constitute a current path for controlling a potential of said bit lines in accordance with said signal at said predetermined node of said data holding means at a time of said verifying operation.

4. The non-volatile semiconductor memory device according to claim 2, wherein said verifying means includes a first verifying transistor which conducts at a time of said verifying operation and a second verifying transistor whose gate is controlled in accordance with a signal on said bit lines, whereby said first and second verifying transistors constitute a current path for inverting data at a predetermined node of said data holding means when verification is completed.

5. A non-volatile semiconductor memory device comprising:

memory cells each constituted of a transistor having a charge accumulating layer, each of said memory cells storing, in write mode, data corresponding to a threshold value which changes greatly as an absolute value of a difference between potentials applied to a drain and a gate becomes larger;

bit lines to each of which drains of a plurality of memory cells are commonly connected;

precharge means, connected to said bit lines, for precharging said bit lines to a predetermined potential in read mode;

bistable data holding means for temporarily holding data read from said memory cells or data to be written in said memory cells;

first transfer control means for connecting said bit lines to one node of said bistable data holding means; and second transfer control means for connecting said bit lines to the other node of said bistable data holding means.

6. The non-volatile semiconductor memory device according to claim 5, wherein in read mode, said bistable data holding means is previously disabled, and is enabled after said bit lines and said precharge means are set in a free running state to thereby hold data according to a potential of said bit lines then.

7. The non-volatile semiconductor memory device according to claim 6, further comprising a first verifying transistor which conducts at a time of a verifying operation and a second verifying transistor whose gate is controlled in accordance with a signal at said other node of said bistable data holding means, whereby said first and second verifying transistors constitute a current path for controlling a potential of said bit lines in accordance with said signal at said other node of said data holding means at a time of said verifying operation.

8. The non-volatile semiconductor memory device according to claim 6, further comprising a first verifying transistor which conducts at a time of a first verifying operation, a second verifying transistor whose gate is controlled in accordance with a signal at said one node of said bistable data holding means, a third verifying transistor which conducts at a time of a second verifying operation, and a fourth verifying transistor whose gate is controlled in accordance with a signal at said other node of said bistable data holding means, whereby said first and second verifying transistors constitute a first current path for controlling a potential of said bit lines in accordance with said signal at said one node of said data holding means at a time of said first verifying operation and said third and fourth verifying transistors constitute a second current path for controlling a potential of said bit lines in accordance with said signal at said other node of said data holding means at a time of said second verifying operation.

9. The non-volatile semiconductor memory device according to claim 5, wherein in read mode, said bistable data holding means is previously disabled, and data held in said bistable data holding means is inverted or uninverted in accordance with a potential of said bit lines after said precharge means and said bit lines are set in a free running state.

10. The non-volatile semiconductor memory device according to claim 9, wherein said bistable data holding means has reset means.

11. The non-volatile semiconductor memory device according to claim 9, further comprising a first verifying transistor which conducts at a time of said verifying operation and a second verifying transistor whose gate is controlled in accordance with a signal on said bit lines, whereby said first and second verifying transistors constitute a current path for inverting data in said data holding means when said verifying operation is completed.

12. The non-volatile semiconductor memory device according to claim 9, further comprising a first verifying transistor which conducts at a time of a first verifying operation, a second verifying transistor which conducts at a time of a second verifying operation, and a third verifying transistor whose gate is controlled in accordance with a signal on said bit lines, whereby said first and third verifying transistors constitute a first current path for inverting data in said data holding means when said first verifying operation is completed and said second and third verifying transistors constitute a second current path for inverting data in said data holding means when said second verifying operation is completed.

13. The non-volatile semiconductor memory device according to claim 5, wherein said memory cells are provided in a matrix form and a structural unit of said bistable data holding means and said first and second transfer control means is commonly connected to a plurality of bit lines.

14. The non-volatile semiconductor memory device according to claim 5 or 13, wherein said memory cells are provided in a matrix form and there are a plurality of structural units of said bistable data holding means and said first and second transfer control means, each structural unit renders said first transfer control means conductive and said second transfer control means non-conductive in read mode to simultaneously sense a plurality of bit line potentials, and after data of said bistable data holding means is entirely unchanged or only a part of said data is changed externally, said each structural unit renders said first transfer control means non-conductive and said second transfer control means conductive in write mode, thereby transferring contents of said data holding means onto said bit lines.

15. The non-volatile semiconductor memory device according to claim 14, wherein a first row of memory cells in said matrix is selected in read mode, and a second row of memory cells in said matrix is selected in write mode.

16. The non-volatile semiconductor memory device according to claim 15, further including means for previously erasing contents of said memory cells connected to said second row before said second row is selected.

17. A non-volatile semiconductor memory device comprising:

memory cells having own threshold values as transistors for distinguishing conductiveness or nonconductiveness, for storing data corresponding to said threshold values;

a latch type sense amplifier having first and second latch nodes for latching complimentary signals, latching data of said memory cells at said first latch node as read data;

first data control means for using said read data as data to be written in said memory cells; and second data control means for using data at said second latch node, which is inverted data of said read data, as data to be written in said memory cells.

18. The non-volatile semiconductor memory device according to claim 17, wherein said first data control means includes first verifying means for setting said data within a threshold value range corresponding to said data to be written.

19. The non-volatile semiconductor memory device according to claim 17, wherein said second data control means includes second verifying means for setting said data within a threshold value range corresponding to said data to be written.

*20. A nonvolatile semiconductor memory device comprising:*

*a memory cell unit comprising a plurality of memory cells connected in series;*

*a bit line connected to said memory cell unit;*

*a latch circuit, having first and second nodes, for storing data;*

*a first transistor having a first end connected to ground and a second end, wherein a conductive state of said first transistor is controlled in accordance with a potential of said bit line;*

*a second transistor having a first end connected to said second node of said latch circuit and a second end connected to said second end of said first transistor, wherein a conductive state of said second transistor is controlled by a first timing signal; and*

*a third transistor having a first end connected to said first node of said latch circuit and a second end connected to said second end of said first transistor, wherein a conductive state of said third transistor is controlled by a second timing signal.*

*21. A device according to claim 20, wherein said first node of said latch circuit is set to a high level and said second node of said latch circuit is set to be a low level after data stored in said latch circuit is written to a selected memory cell of said memory cell unit.*

*22. A device according to claim 20, wherein said latch circuit comprises a flip-flop circuit including first and second inverter circuits, wherein an input terminal of said first inverter circuit is coupled to an output terminal of said second inverter circuit and an output terminal of said first inverter circuit is coupled to an input terminal of said second inverter circuit.*

*23. A nonvolatile semiconductor memory device comprising:*

*a memory cell unit comprising a plurality of memory cells connected in series;*

*a bit line connected to said memory cell unit;*

*a latch circuit, having first and second nodes, for storing data;*

*a first transistor having a current path connected between said bit line and said first node of said latch circuit, wherein said first transistor supplies data stored in said latch circuit to a selected memory cell of said memory cell unit in accordance with a first timing signal supplied to a gate thereof;*

*a second transistor having a first end connected to ground and a second end, wherein a conductive state of said second transistor is controlled in accordance with a potential of said bit line;*

*a third transistor having a first end connected to said second node of said latch circuit and a second end connected to said second end of said second transistor, wherein a conductive state of said third transistor is controlled by a second timing signal; and*

*a fourth transistor having a first end connected to said first node of said latch circuit and a second end connected to said second end of said second transistor, wherein a conductive state of said fourth transistor is controlled by a third timing signal.*

*24. A device according to claim 23, wherein said latch circuit comprises a flip-flop circuit including first and second inverter circuits, wherein an input terminal of said first inverter circuit is connected to an output terminal of said second inverter circuit and an output terminal of said first inverter circuit is connected to an input terminal of said second inverter circuit.*

*25. A nonvolatile semiconductor memory device comprising:*

*memory cell units, each memory cell unit comprising a plurality of memory cells connected in series;*

*bit lines connected to said memory cell units;*

*latch circuits for storing data, each latch circuit having first and second nodes and being coupled to a respective corresponding one of said bit lines;*

*first transistors, each first transistor having a first end connected to ground and a second end, wherein conductive states of said first transistors are controlled in accordance with a potential of a respective corresponding one of said bit lines;*

*second transistors, each second transistor having a first end connected to the second node of a respective corresponding one of said latch circuits and a second end connected to the second end of a respective corresponding one of said first transistors, wherein conductive states of said second transistors are controlled by a first timing signal; and*

*third transistors, each third transistor having a first end connected to the first node of a respective corresponding one of said latch circuits and a second end connected to a second end of a respective corresponding one of said first transistors, wherein conductive states of said third transistors is controlled by a second timing signal.*

*26. A nonvolatile semiconductor memory device comprising:*

*a memory cell unit comprising a plurality of memory cells connected in series;*

*a bit line connected to said memory cell unit;*

*a flip-flop circuit for storing data coupled to said bit line, said flip-flop circuit including first and second inverter circuits wherein an input terminal of said first inverter circuit is connected to an output terminal of said second inverter circuit and an output terminal of said first inverter circuit is connected to an input terminal of said second inverter circuit;*

*a first transistor having a first end connected to ground and a second end, wherein a conductive state of said first transistor is controlled in accordance with a potential of said bit line; and*

*second and third transistors having first ends commonly connected to the second end of said first transistor, a second end of said second transistor being connected to said output terminal of said first inverter circuit and a second end of said third transistor being connected to said output terminal of said second inverter circuit, wherein conductive states of said second and third transistors are controlled by respective first and second timing signals.*

* * * * *